United States Patent
Chen et al.

(10) Patent No.: US 11,024,603 B2
(45) Date of Patent: Jun. 1, 2021

(54) MANUFACTURING METHOD AND A RELATED STACKABLE CHIP PACKAGE

(71) Applicant: POWERTECH TECHNOLOGY INC., Hsinchu County (TW)

(72) Inventors: Ming-Chih Chen, Hsinchu County (TW); Hung-Hsin Hsu, Hsinchu County (TW); Yuan-Fu Lan, Hsinchu County (TW); Chi-An Wang, Hsinchu County (TW); Hsien-Wen Hsu, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 16/386,276

(22) Filed: Apr. 17, 2019

(65) Prior Publication Data
US 2019/0244934 A1 Aug. 8, 2019

Related U.S. Application Data

(63) Continuation-in-part of application No. 15/867,577, filed on Jan. 10, 2018, now Pat. No. 10,354,978.

(51) Int. Cl.
| | |
|---|---|
| H01L 25/065 | (2006.01) |
| H01L 21/76 | (2006.01) |
| H01L 23/31 | (2006.01) |
| H01L 21/768 | (2006.01) |
| H01L 23/00 | (2006.01) |
| H01L 21/56 | (2006.01) |

(52) U.S. Cl.
CPC ........ *H01L 25/0657* (2013.01); *H01L 21/568* (2013.01); *H01L 21/76805* (2013.01); *H01L 23/3107* (2013.01); *H01L 24/08* (2013.01); *H01L 24/17* (2013.01); *H01L 24/19* (2013.01); *H01L 24/20* (2013.01); *H01L 24/96* (2013.01); *H01L 2224/02371* (2013.01); *H01L 2224/32145* (2013.01)

(58) Field of Classification Search
CPC ....... H01L 25/0657; H01L 2224/32145; H01L 21/568
USPC ......................................... 257/621
See application file for complete search history.

(56) References Cited

U.S. PATENT DOCUMENTS

| | | | |
|---|---|---|---|
| 2013/0147063 A1* | 6/2013 | Park | H01L 23/5389 257/777 |
| 2018/0040587 A1 | 2/2018 | Tao | |
| 2019/0214366 A1 | 7/2019 | Chen | |

FOREIGN PATENT DOCUMENTS

| | | |
|---|---|---|
| TW | 201027692 | 7/2010 |
| TW | 201801265 | 1/2018 |
| TW | 201801279 | 1/2018 |

* cited by examiner

*Primary Examiner* — Didarul A Mazumder
(74) *Attorney, Agent, or Firm* — Winston Hsu

(57) ABSTRACT

A manufacturing method is applied to set a stackable chip package. The manufacturing method includes encapsulating a plurality of chips stacked with each other, disposing a lateral surface of the stacked chips having conductive elements onto a substrate, disassembling the substrate from the conductive elements when the stacked chips are encapsulated, and disposing a dielectric layer with openings on the stacked chips to align the openings with the conductive elements for ball mounting process.

6 Claims, 16 Drawing Sheets

MANUFACTURING METHOD AND A RELATED STACKABLE CHIP PACKAGE

CROSS REFERENCE TO RELATED APPLICATIONS

This application is a continuation in part of U.S. application Ser. No. 15/867,577, filed 2018 Jan. 10.

BACKGROUND OF THE INVENTION

1. Field of the Invention

The present invention relates to a semiconductor package, and more particularly, to a manufacturing method and a related stackable chip.

2. Description of the Prior Art

Stacking a plurality of chips has been implemented in various semiconductor packages to achieve miniaturization of component integration. The wire bonding method and the through silicon via (TSV) with micro bump are conventional ways to provide electrical interconnection between the stacked chips and the external terminals. However, the conventional ways have following disadvantages.

When the chips are connected to the external terminals by wire bonding, the intervals between the bonding wires need to be preserved to avoid contacts between the adjacent bonding wires. The intervals inevitably increase the size of the conventional stacked package. Thus, the conventional stacked package with bonding wires does not easily achieve miniaturization. In addition, the wire bonding process takes a lot of time since all of the wires for one conventional stacked package cannot be bonded simultaneously. Therefore, the unit per hour (UPH) of the conventional stacked package manufactured by the wire bonding process is relatively low.

When the chips are connected to each other by the TSV and the micro bumps, the TSV increases stacked heights and processing complexity leading to larger package thickness and lower manufacturing yield. In addition, the requirements for the precision of alignment and locating among the micro bumps are very high. When the dimension of the conventional stacked packages become larger and larger, the position shift of the micro bumps becomes greater and greater leading to poor packaging yield.

SUMMARY OF THE INVENTION

The present invention provides a manufacturing method and a related stackable chip for solving above drawbacks.

According to the claimed invention, a manufacturing method of setting a stackable chip package includes encapsulating a plurality of chips stacked with each other, disposing a lateral surface of the stacked chips having conductive elements onto a substrate, disassembling the substrate from the conductive elements when the stacked chips are encapsulated, and disposing a dielectric layer with openings on the stacked chips to align the openings with the conductive elements for ball mounting process.

According to the claimed invention, the stackable chip package includes a plurality of chips, a dielectric layer, at least one redistribution layer and at least one external terminal. The plurality of chips is stacked as stacked chips and encapsulated via a substrate. The stacked chips has conductive elements exposed out of encapsulation by a removal of the substrate. The dielectric layer is disposed on the stacked chips, and has openings aligned with the conductive elements. The redistribution layer is disposed inside the openings to contact the conductive elements. The external terminal is disposed on the redistribution layer for providing an electrical transmission channel of the stackable chip package.

These and other objectives of the present invention will no doubt become obvious to those of ordinary skill in the art after reading the following detailed description of the preferred embodiment that is illustrated in the various figures and drawings.

DETAILED DESCRIPTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
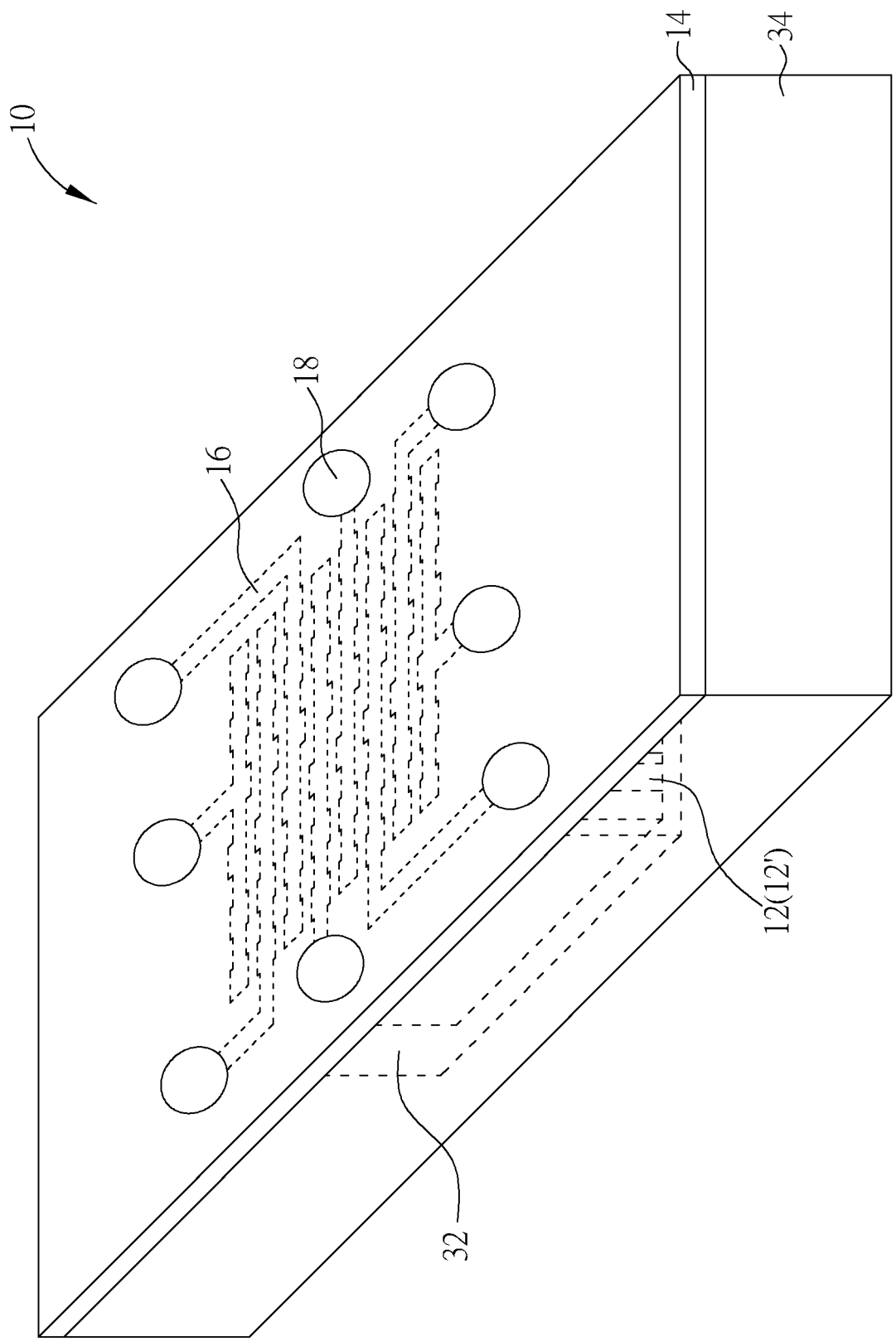
FIG. 1 is a diagram of a stackable chip package according to an embodiment of the present invention.

With reference to FIG. 1, the stackable chip package 10 can include a plurality of chips 12, a dielectric layer 14, at least one redistribution layer 16 and at least one external terminal 18. Amounts of the redistribution layer 16 and the external terminal 18 are not limited to the embodiments shown in the figures, and depend on design demand. The plurality of chips 12 can be stacked as stacked chips 12', and several conductive elements 20 of the plurality of chips 12 can be located on a lateral surface 13 of the stacked chips 12' and exposed via openings 22 of the dielectric layer 14. The redistribution layer 16 and the external terminal 18 can be disposed on the dielectric layer 14 and connected to the conductive elements 20 via the openings 22. The manufacturing method can simultaneously connect the redistribution layer 16 and the external terminal 18 to the conductive elements 20 for establish an electrical transmission channel of the stackable chip package 10.

The plurality of chips 12 assembled as the stacked chips 12' can be encapsulated by specific encapsulation. The conductive elements 20 of the plurality of chips 12 can be exposed out of the encapsulation when the stacked chips 12' are encapsulated via first encapsulation and second encapsulation. The dielectric layer 14 can be disposed on an outside surface of the stacked chips 12' whereon the conductive elements 20 are located. The redistribution layer 16 can be disposed on the dielectric layer 14 and contact the conductive elements 20 via the openings 22 of the dielectric layer 14. The redistribution layer 16 may be made of metal via sputtering for being adhesion, a diffusion barrier and a conduction layer of the ball mounting process. The external terminal 18 can be disposed on the redistribution layer 16 for changing position of contact points of the stackable chip package 10, and therefore the stackable chip package 10 can be suitable for a variety of modules.

Figure 2:
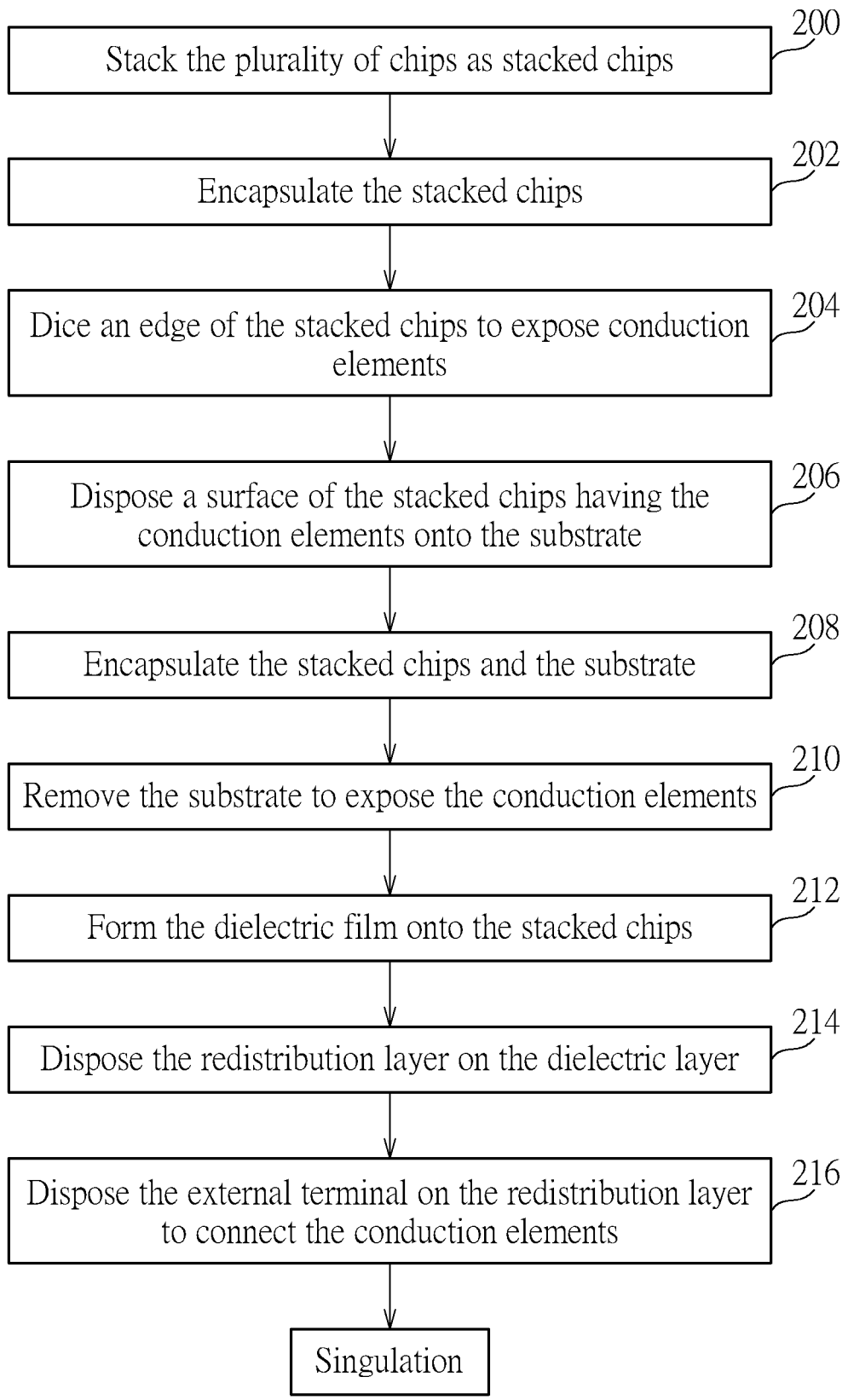
FIG. 2 is a flow chart of a manufacturing method of setting the stackable chip package according to the embodiment of the present invention.
Figure 3A:
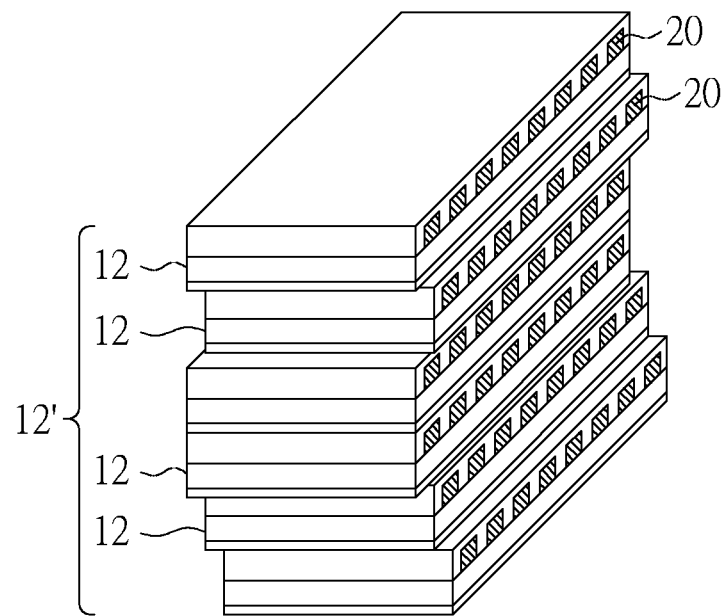
FIGS. 3A, 4A, 5A, 6A, 7A, 8A, 9A and 10A are perspective views of the stackable chip package in different operation modes according to the embodiment of the present invention.
Figure 3B:
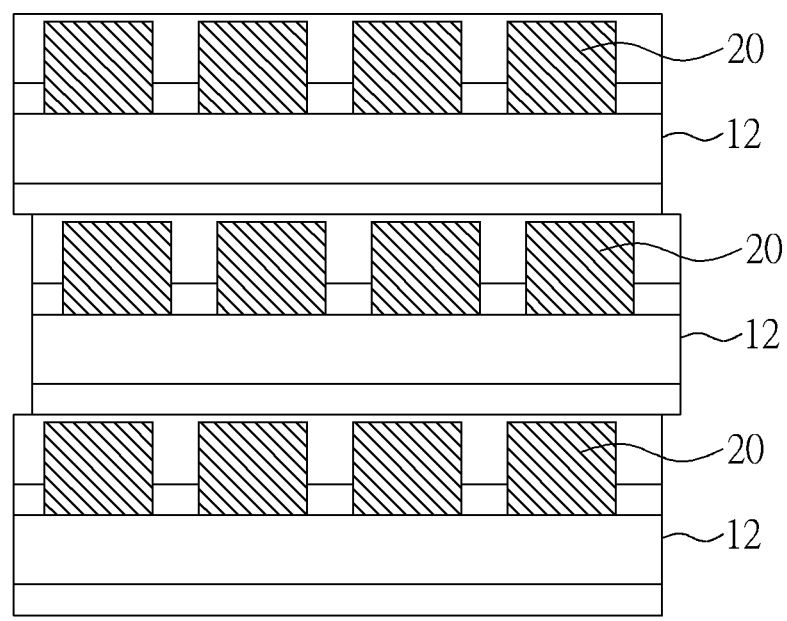
FIGS. 3B, 4B, 5B, 6B, 7B, 8B, 9B and 10B are front views of the stackable chip package in different operation modes according to the embodiment of the present invention.
Figure 4A:
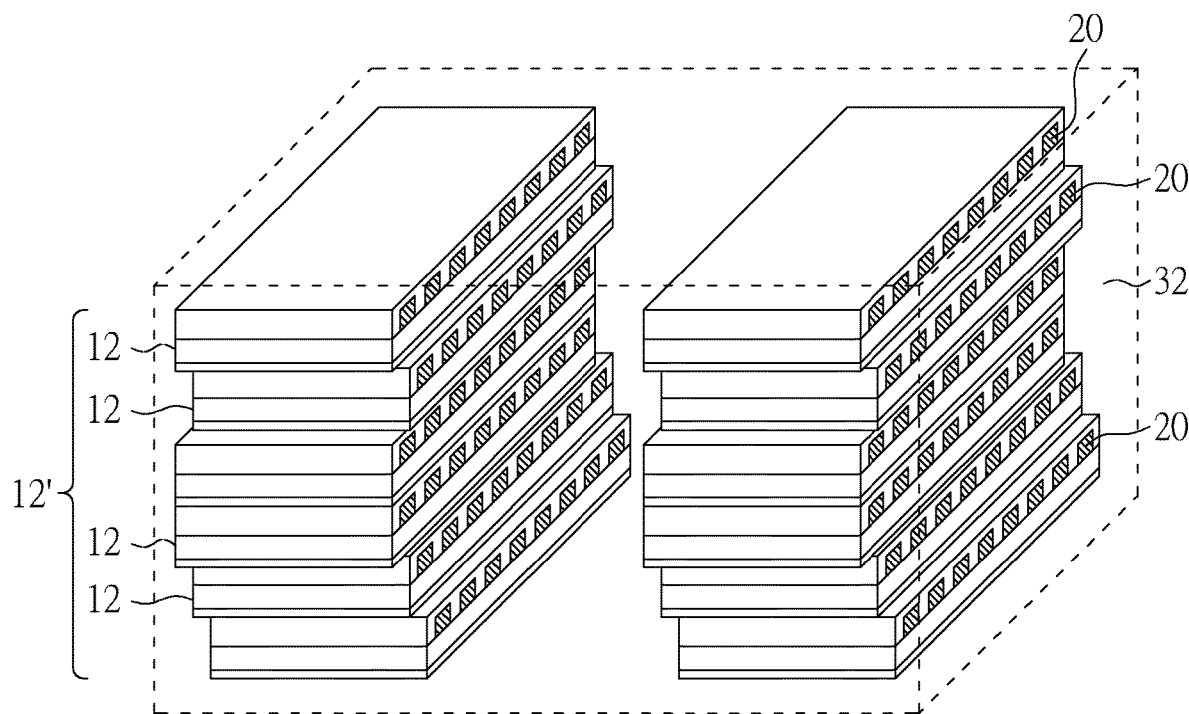
Figure 4B:
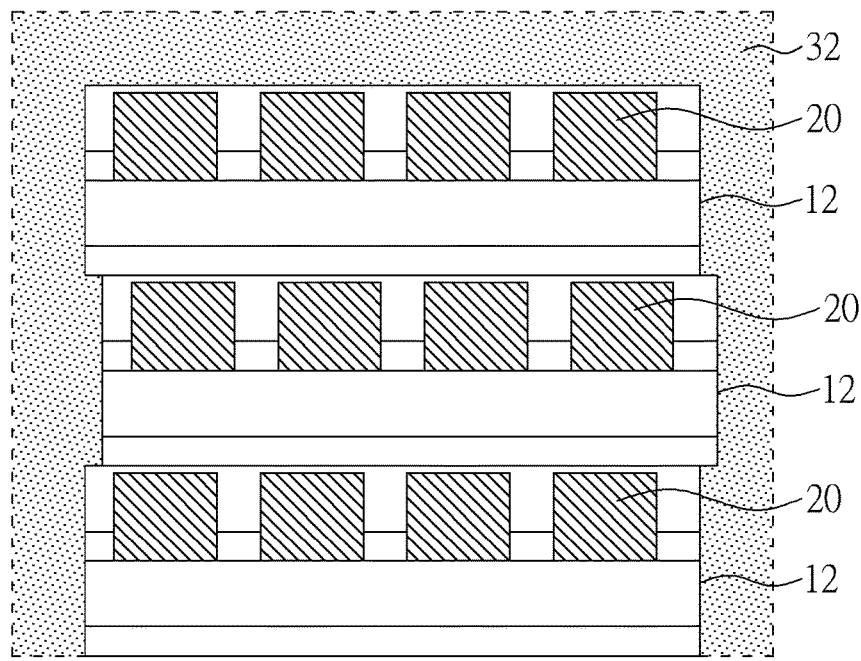

The manufacturing method illustrated in FIG. 2 is applied to the stackable chip package 10 shown in FIG. 1. With reference to FIGS. 3A and 3B, step S200 is executed to contact a top surface of one chip 12 against a bottom surface of another chip 12 for stacking the plurality of chips 12 as the stacked chips 12'. The plurality of chips 12 can be adhered to each to each other by using adhesive set between adjacent chips 12. The plurality of chips 12 may be easily staggered when being stacked because of die bond technology. With reference to FIGS. 4A and 4B, step S202 is executed to encapsulate the stacked chips 12' via the first encapsulation 32. The first encapsulation 32 is adapted to constrain relative motion between the adjacent chips 12 and further to protect the stacked chips 12'.

Figure 5A:
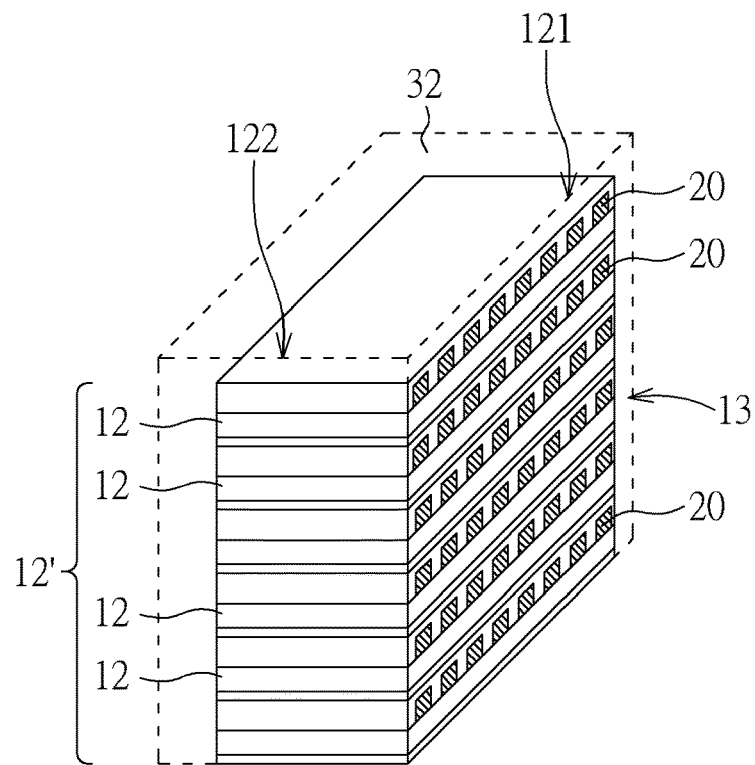
Figure 5B:
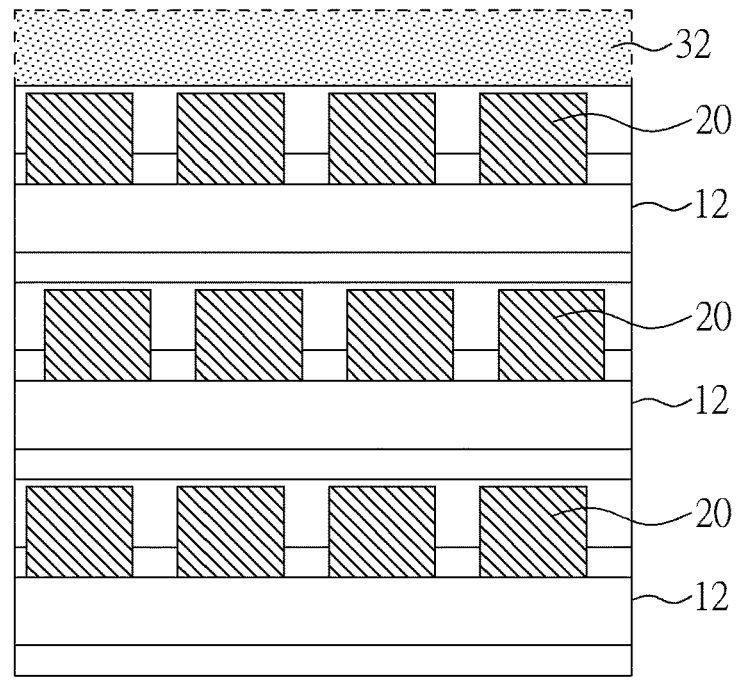
Figure 6A:
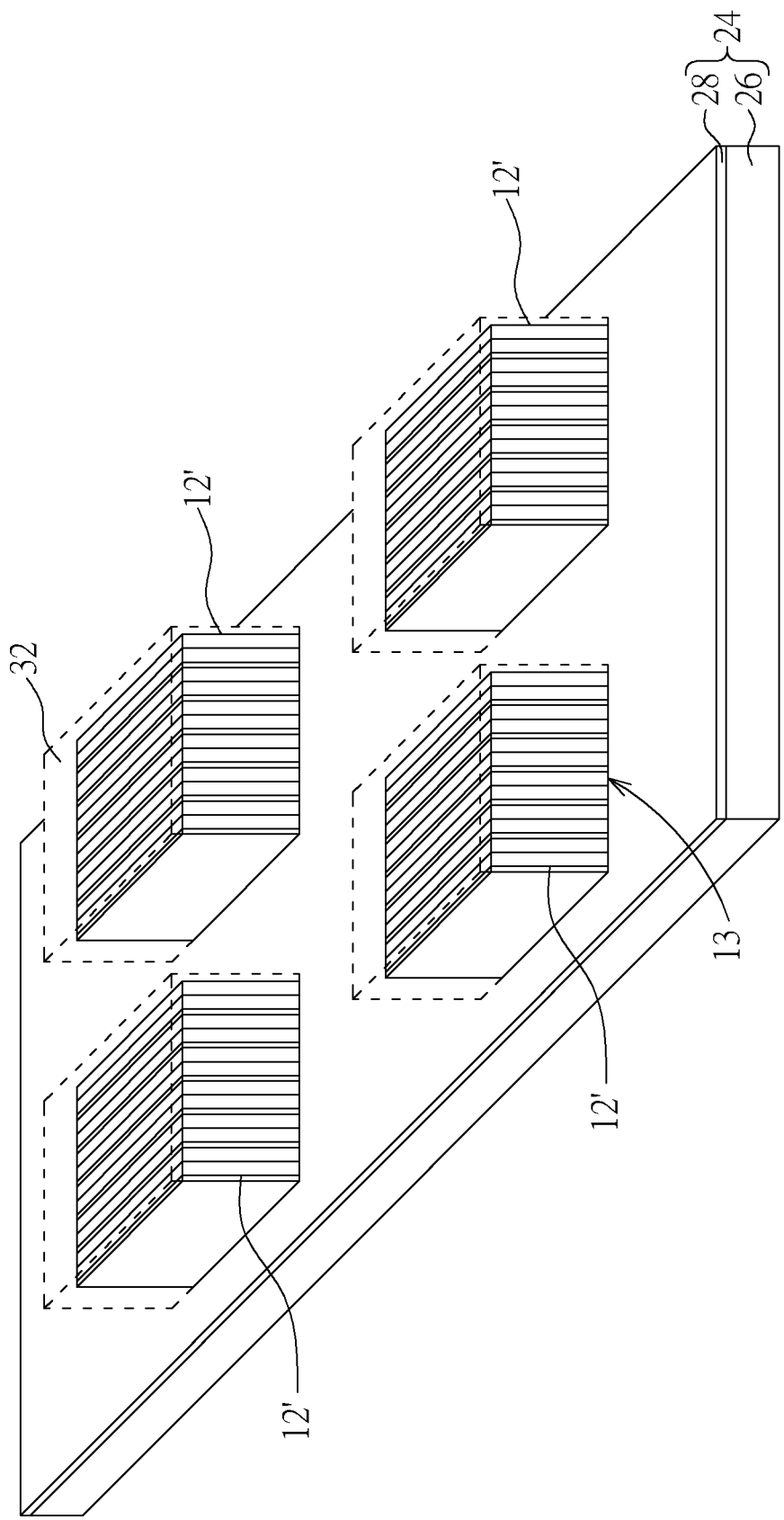
Figure 6B:
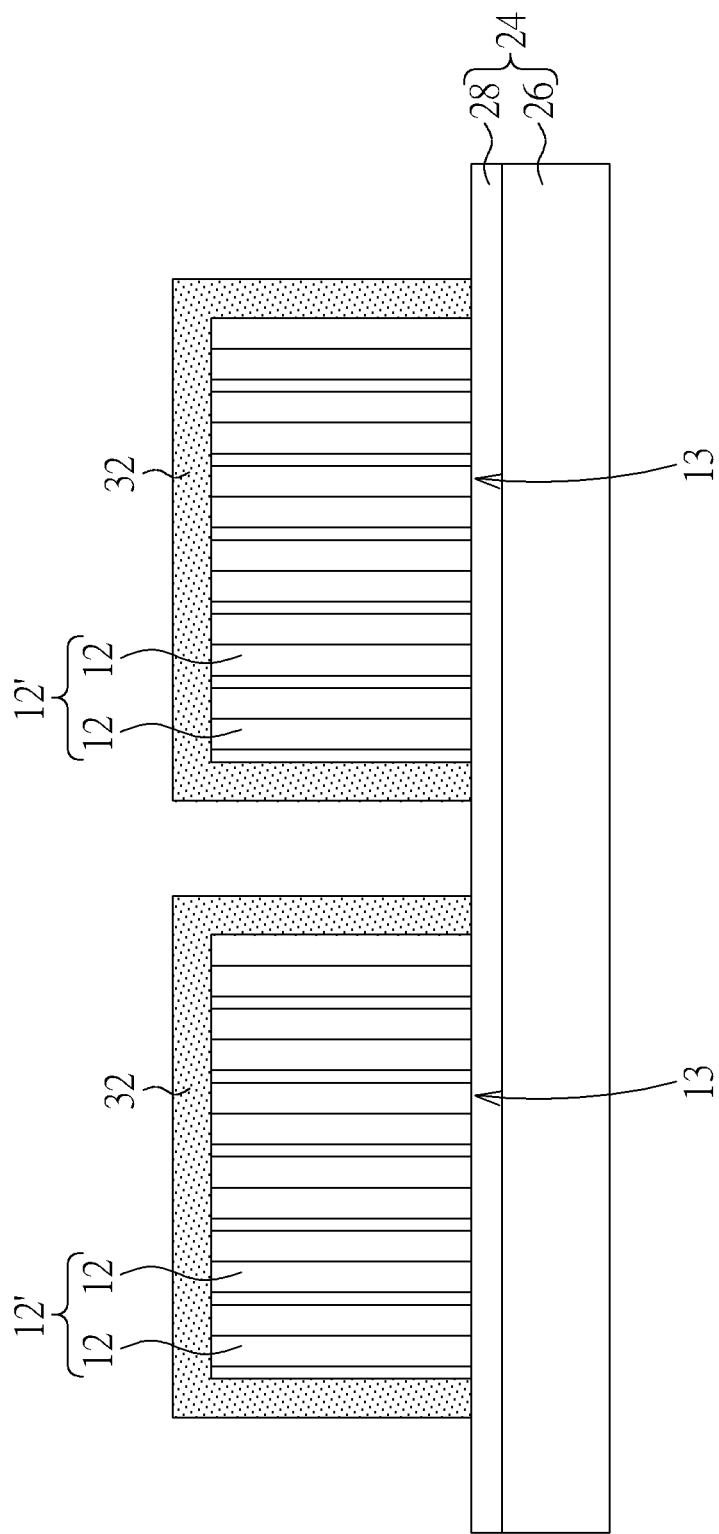

With reference to FIGS. 5A and 5B, step S204 is executed to dice an edge 121 of the stacked chips 12' so as to expose the conduction pads 20 for contact alignment, and further to dice other edges 122 of the stacked chips 12', which have no exposed contact, for edge alignment. With reference to FIGS. 6A and 6B, step S206 is executed to turn over the stacked chips 12' for facing the lateral surface 13 of the stacked chips 12', which has the conductive elements 20, toward a substrate 24, so as to dispose the lateral surface onto the substrate 24. The substrate 24 can include a metal carrier 26 and a releasing film 28. The stacked chips 12' can be disposed on the metal carrier 26 via the releasing film 28. The substrate 24 may be assembled with the stacked chips 12' via die bond technology and sputter metal technology.

Figure 7A:
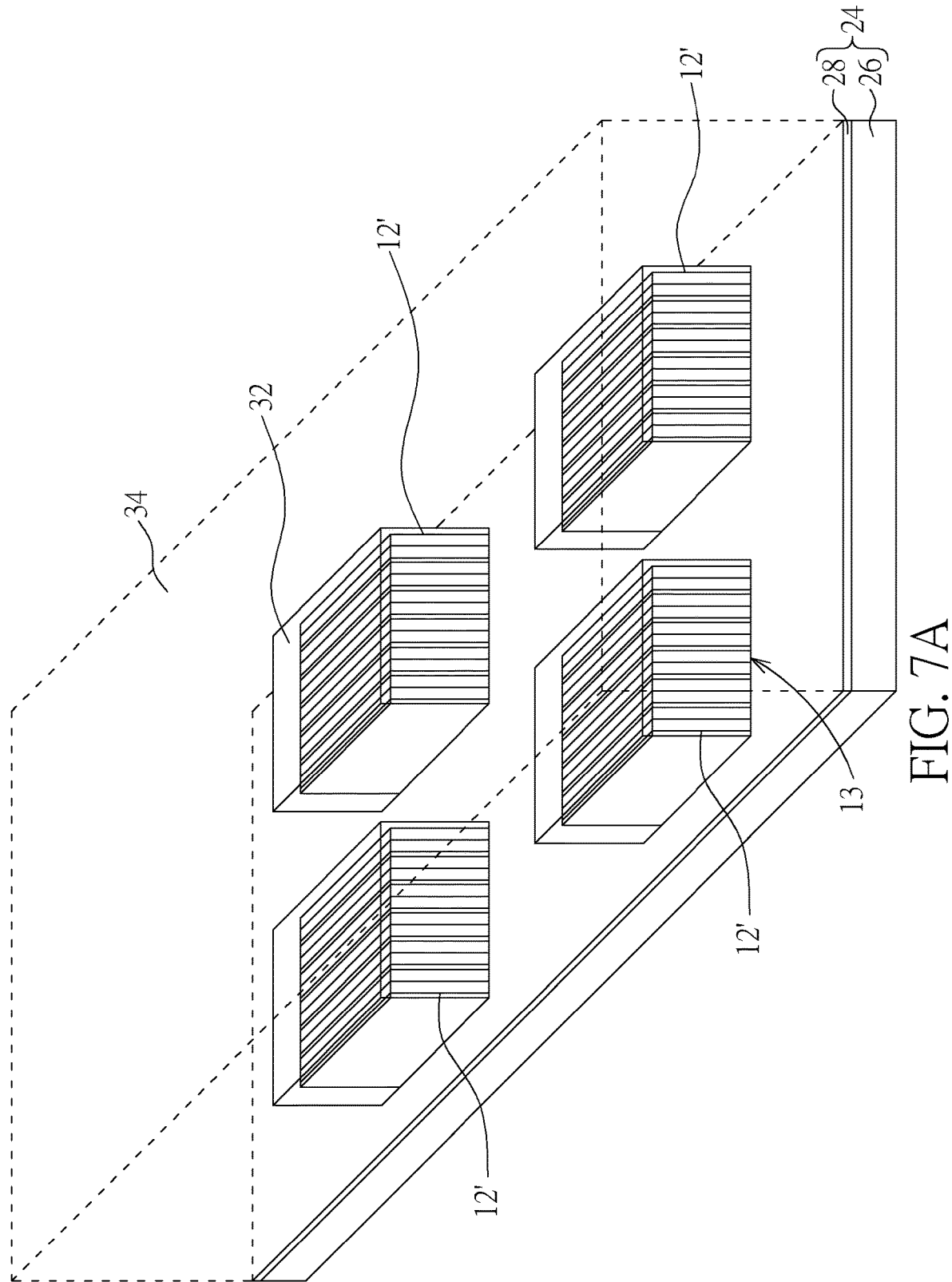
Figure 7B:
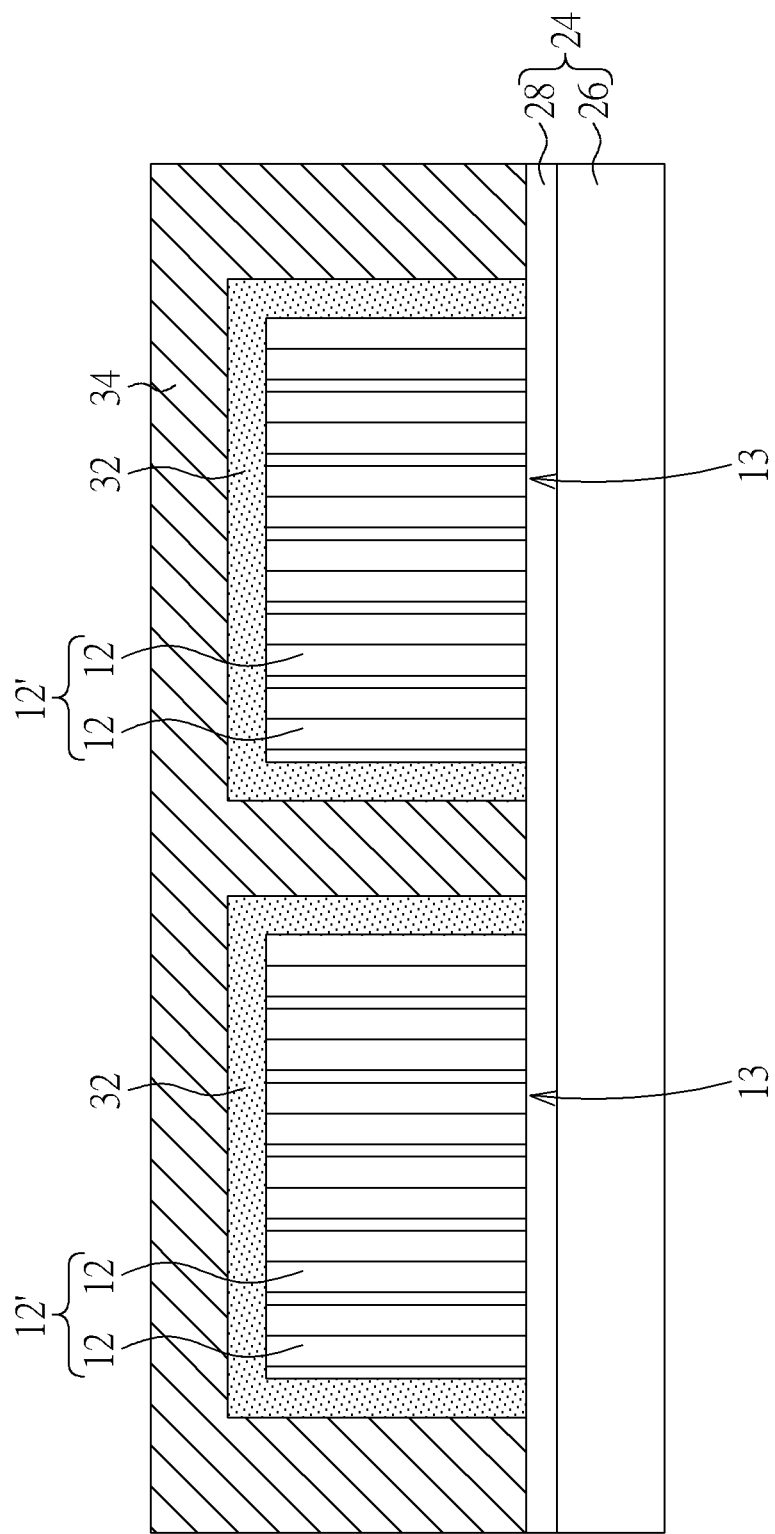
Figure 8A:
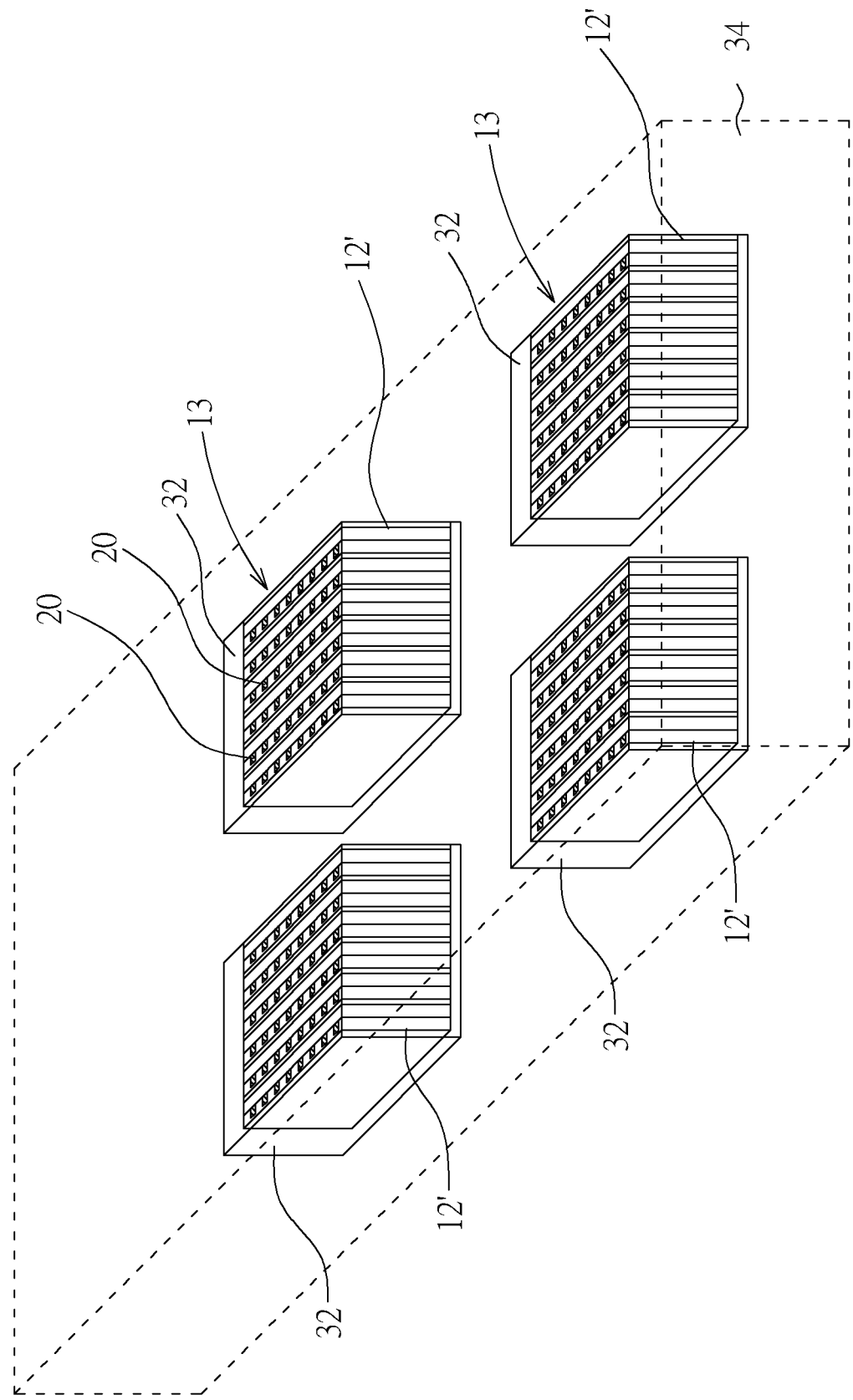
Figure 8B:
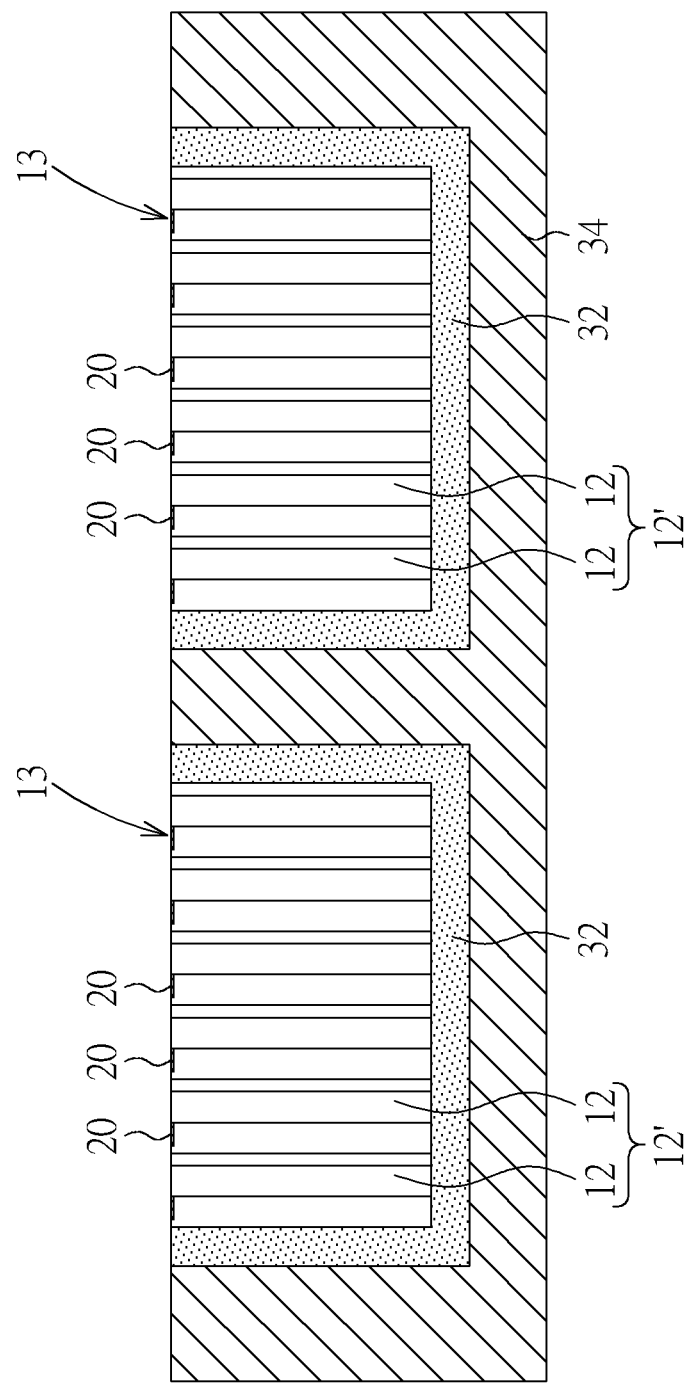
Figure 9A:
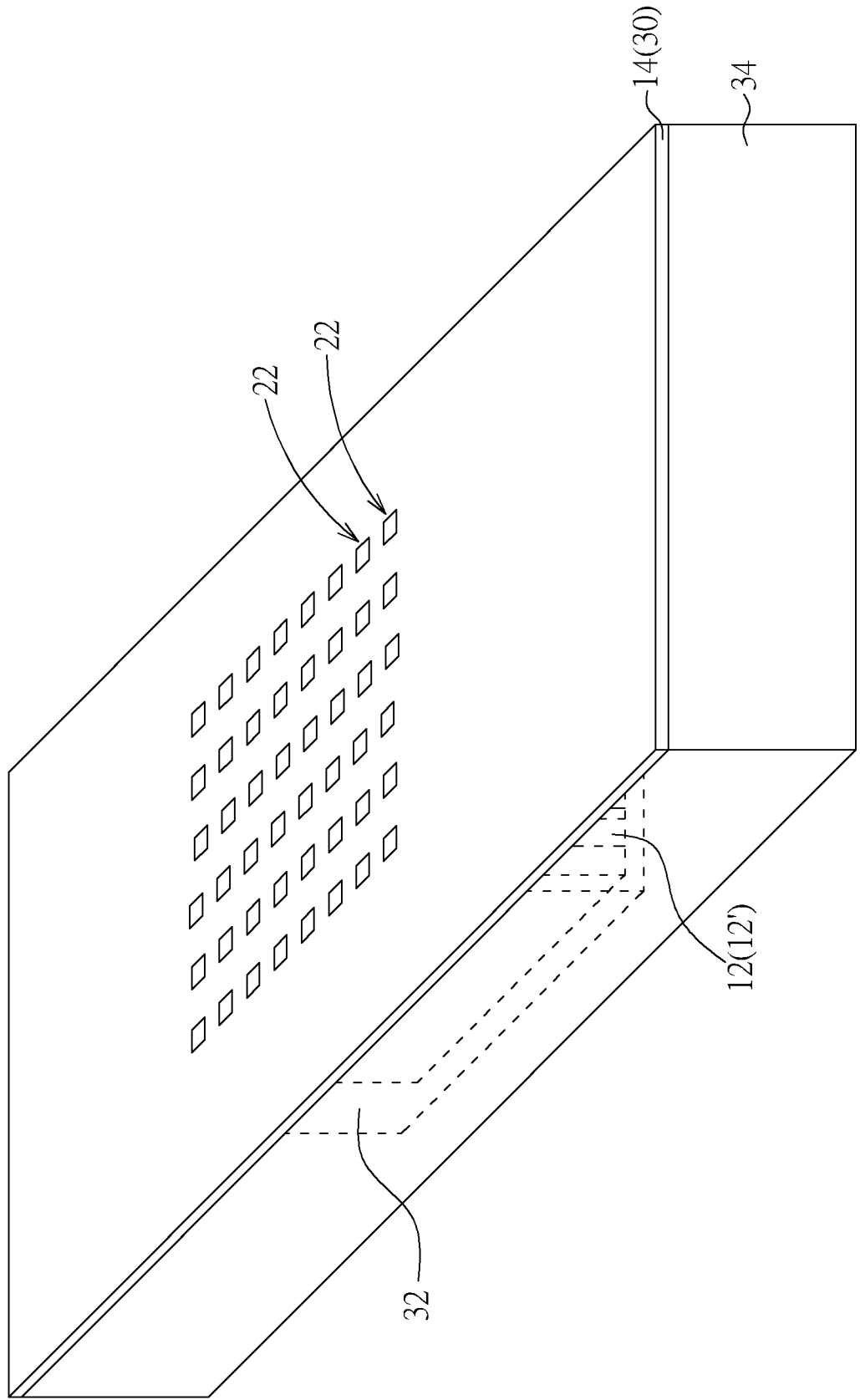
Figure 9B:
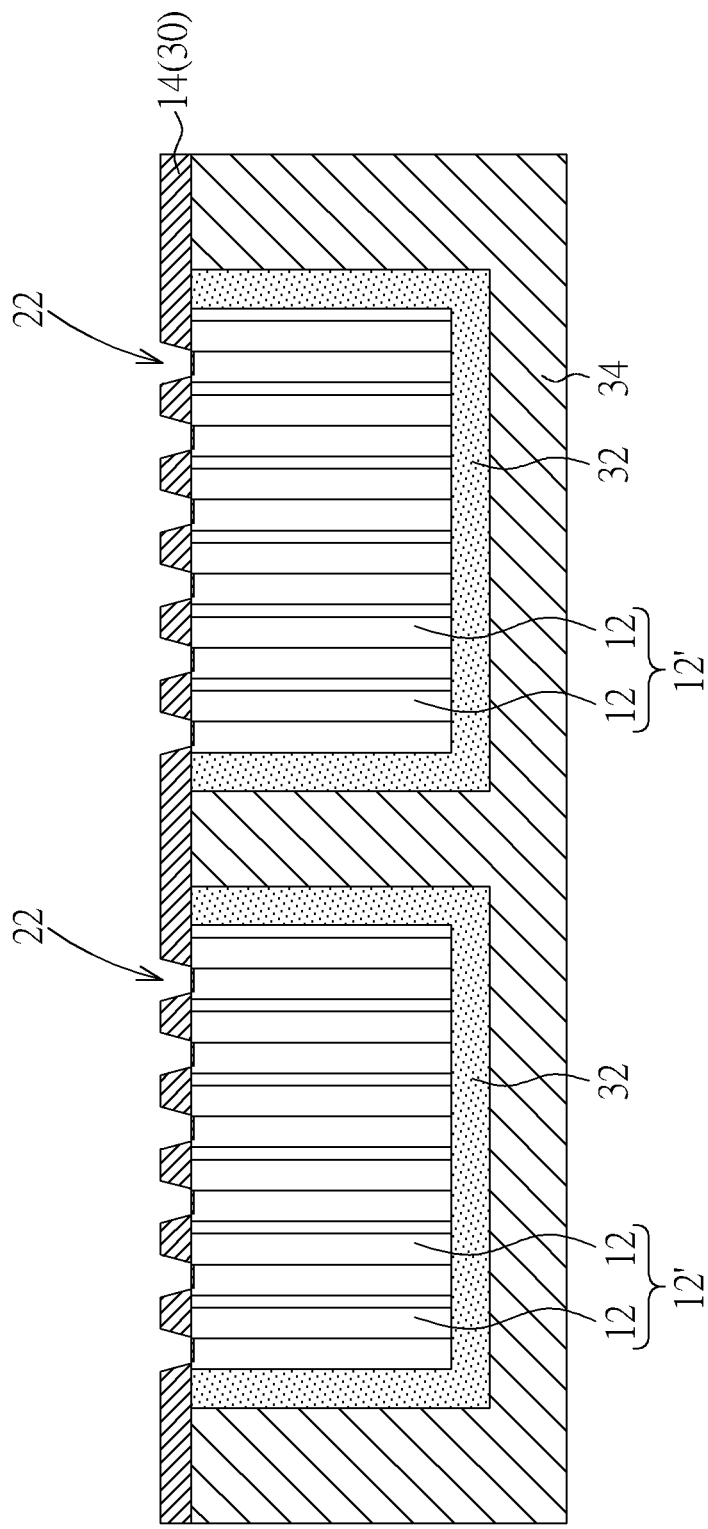

With reference to FIGS. 7A and 7B, step S208 is executed to encapsulate the stacked chips 12' and the substrate 24 via the second encapsulation 34. The second encapsulation 34 is adapted to fix relative motion between adjacent stacked chips 12' and further to protect the stacked chips 12'. With reference to FIGS. 8A and 8B, step S210 is executed to turn over the stacked chips 12' encapsulated by the second encapsulation 34 and remove the releasing film 28 for disassembling the metal carrier 26 from the stacked chips 12', so as to expose the conductive elements 20 via the lateral surface of the stacked chips 12'. With reference to FIGS. 9A and 9B, step S212 is executed to form a dielectric film 30 onto the stacked chips 12'. The dielectric film 30 can be etched in accordance with position of the conductive elements 20, so as to form the dielectric layer 14 having the openings 22. In another possible embodiment, the dielectric layer 14 with the openings 22 may be pre-formed and disposed on the stacked chips 12' for aligning the openings 22 with the conductive elements 20.

Figure 10A:
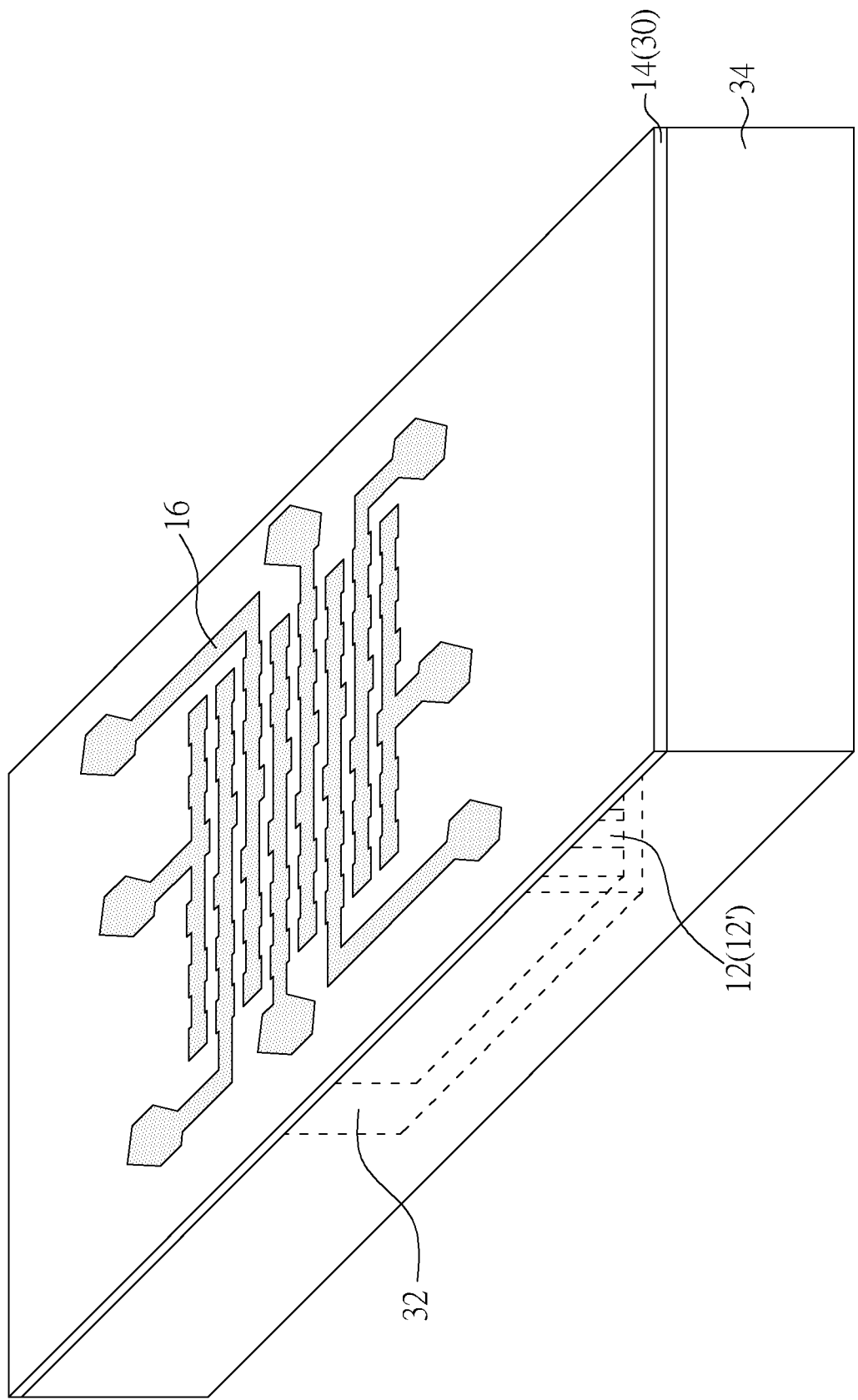
Figure 10B:
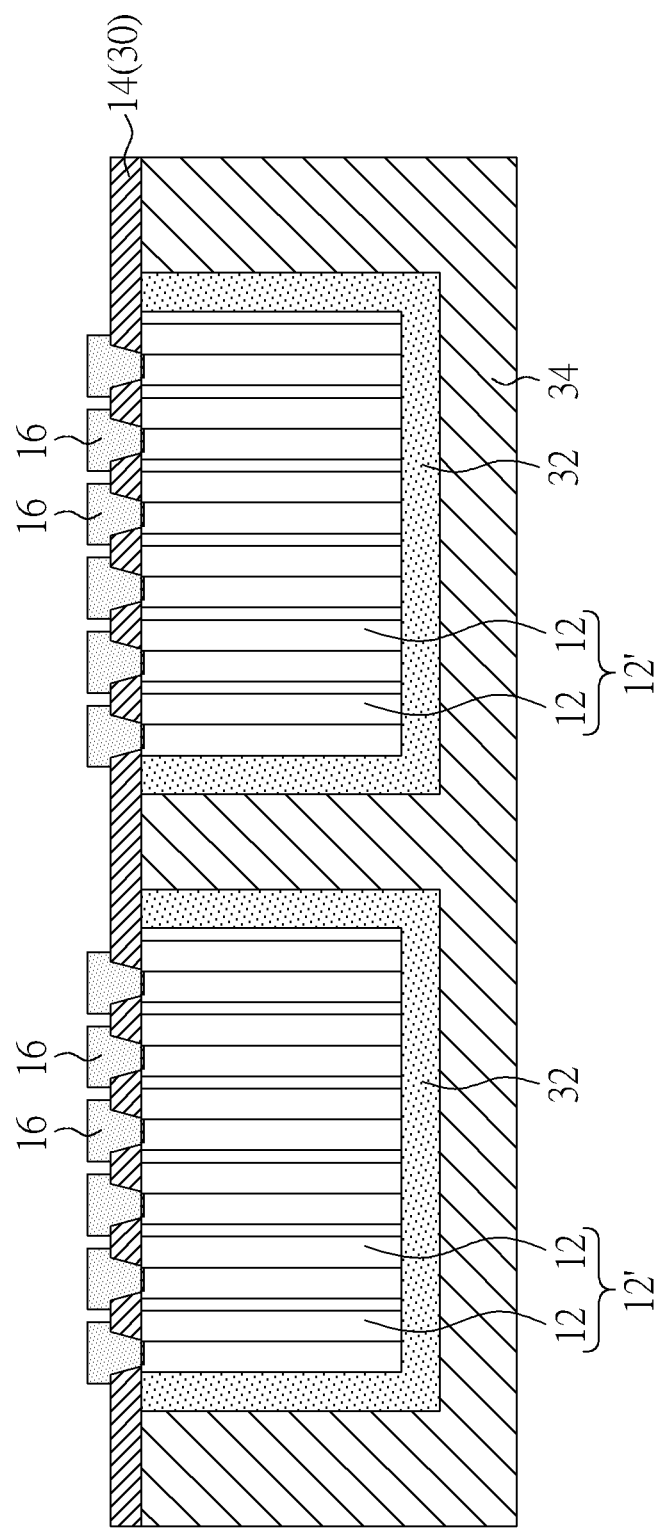
Figure 11:
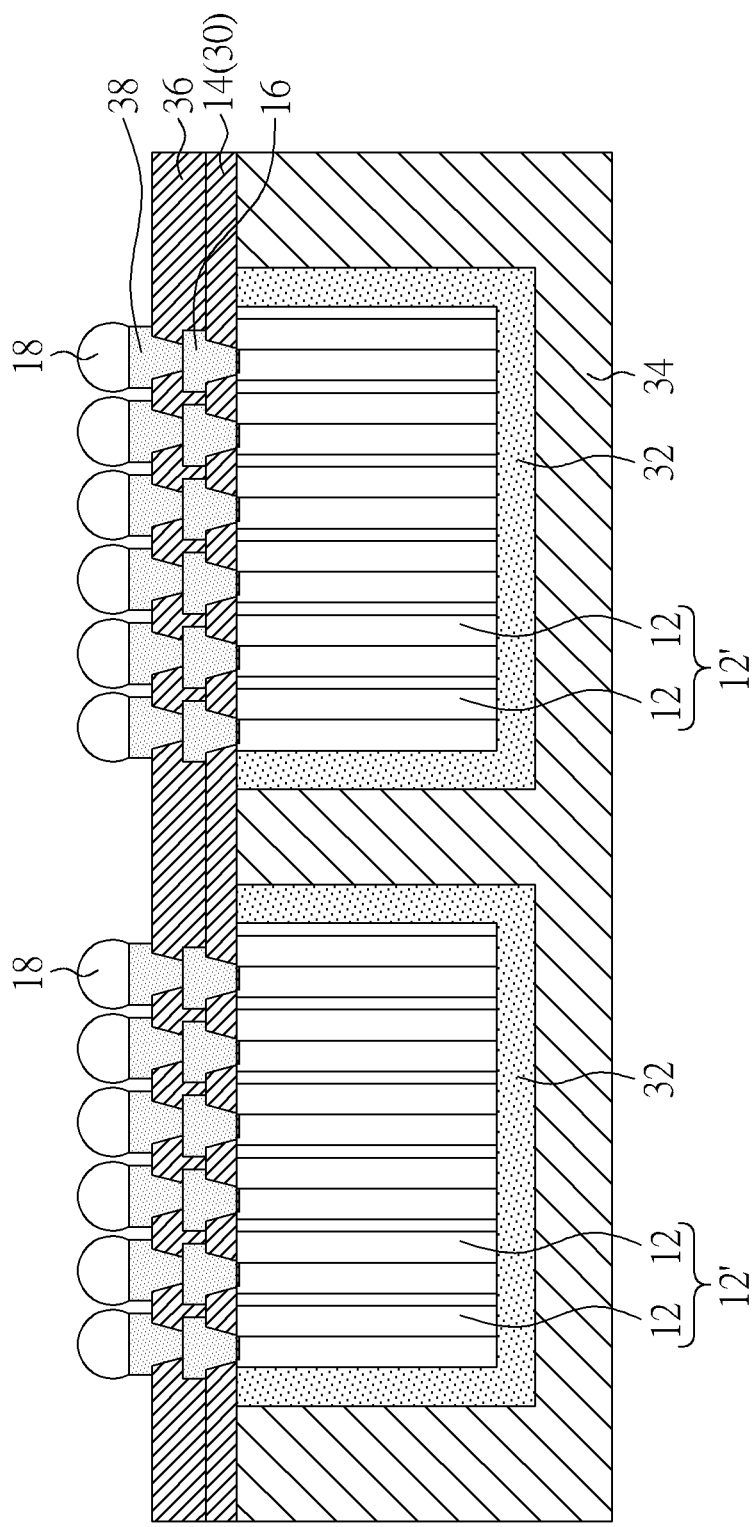
FIG. 11 is a front view of the stackable chip package shown in FIG. 1.

With reference to FIGS. 10A and 10B, step S214 is executed to dispose the redistribution layer 16 on the dielectric layer 14 to contact the conductive elements 20 via the openings 22. In this embodiment, another dielectric layer 36 can be formed on the redistribution layer 16, and a metallic thin film 38 can be formed on the dielectric layer 36 to contact the redistribution layer 16 via openings on the dielectric layer 36. With reference to FIG. 11, step S216 is executed to dispose the external terminal 18 on the metallic thin film 38, and the external terminal 18 can be electrically connected to the conductive elements 20 via the redistribution layer 16 and the metallic thin film 38. Then, singulation can be performed to the stacked chips 12' via a scribed line A. The external terminal 18 can be a solder ball, a solder paste, a contact pad or pin.

In the present invention, the stackable chip package can turn over the stacked chips to dispose the lateral surface of the stacked chips, which has the conductive elements, onto the substrate, and then encapsulate the stacked chips and the substrate into the second encapsulation. Instead of removing the second encapsulation, the stackable chip package can disassemble the substrate from the stacked chips to expose the lateral surface having the conductive elements. The dielectric layer, the redistribution layer, the metallic thin film and the external terminal can be sequentially disposed on the stacked chips according to redistribution layer process and under bump metallurgy process. Therefore, the present invention can rapidly manufacture the stackable chip package with great memory capacity, so as to decrease manufacturing cost and increase productivity (such as unit per hour, UUPH), and further can avoid electromagnetic interference because of its specific structural design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A stackable chip package, comprising:
   a plurality of chips stacked as stacked chips and encapsulated via a first encapsulation, the stacked chips being encapsulated via a second encapsulation on a substrate, the stacked chips having conductive elements exposed out of the first encapsulation and the second encapsulation by a removal of the substrate;
   a dielectric layer disposed on the stacked chips, the dielectric layer having openings aligned with the conductive elements;
   at least one redistribution layer disposed inside the openings to contact the conductive elements; and
   at least one external terminal disposed on the at least one redistribution layer for providing an electrical transmission channel of the stackable chip package;
   wherein the plurality of chips are stacked with each other by contacting a top surface of one chip against a bottom surface of another chip, and the conductive elements are disposed on a lateral surface of the stacked chips.

2. The stackable chip package of claim 1, wherein the stacked chips are turned over to face the conductive elements upward for being encapsulated.

3. The stackable chip package of claim 1, wherein an edge of the stacked chips is diced to align the conductive elements on a lateral surface of the stacked chips.

4. The stackable chip package of claim 3, wherein other edges of the stacked chips are diced for edge alignment.

5. The stackable chip package of claim 1, wherein the substrate comprises a metal carrier and a releasing film, the stacked chips are disposed on the metal carrier via the releasing film, and the releasing film is removed to disassemble the metal carrier from the stacked chips.

6. The stackable chip package of claim 1, wherein a dielectric film is disposed on the stacked chips, and further etched to form the dielectric layer having the openings in accordance with position of the conductive element.

* * * * *